United States Patent [19]

Soga et al.

[11] Patent Number: 5,525,023
[45] Date of Patent: Jun. 11, 1996

[54] CHIP COMPONENT SUPPLY APPARATUS

[75] Inventors: Tomitatu Soga, Hirakata; Kunio Tanaka, Kadoma; Shigetoshi Negishi, Suita; Hidekazu Nakamura, Ibaraki; Hiroyuki Fujiwara, Osaka; Kenji Kato; Takayuki Fujita, both of Hirakata; Takashi Nakanishi, Ashiya, all of Japan

[73] Assignee: Matsushita Electric Industrial Co., Ltd., Kadoma, Japan

[21] Appl. No.: 164,713

[22] Filed: Dec. 10, 1993

[30] Foreign Application Priority Data

Dec. 10, 1992 [JP] Japan ................................. 4-330241

[51] Int. Cl.$^6$ ................................................ B65G 47/14
[52] U.S. Cl. ........................................ 414/414; 198/396
[58] Field of Search ............................ 198/390, 391, 198/396, 533; 414/414, 304, 403, 416; 221/181

[56] References Cited

U.S. PATENT DOCUMENTS

| | | | |
|---|---|---|---|
| 4,201,313 | 5/1980 | Kirsch | 198/396 |
| 4,459,743 | 7/1984 | Watanabe et al. | |
| 4,460,108 | 7/1984 | Noda et al. | 221/181 |
| 4,744,455 | 5/1988 | Dragotta et al. | 198/396 |
| 5,064,341 | 11/1991 | Pippin | 414/797.6 |

FOREIGN PATENT DOCUMENTS

| | | |
|---|---|---|
| 0301691 | 2/1989 | European Pat. Off. . |
| 2244482 | 12/1991 | United Kingdom . |

Primary Examiner—David A. Bucci
Assistant Examiner—Thomas J. Brahan
Attorney, Agent, or Firm—Willian Brinks Hofer Gilson & Lione

[57] ABSTRACT

A chip component supply apparatus of the invention includes a container box for storing chip components in pieces, a means for conveying chip components from the container box onto a conveyor belt, which moves intermittently and conveys the transferred chip components toward a take-out port area where a vacuum suction nozzle of an electronic component placement machine takes out the chip components. A stopper is positioned in the vicinity of the take-out port area for stopping the chip components conveyed by the conveyor belt at the take-out port area. The stopper moves and departs from the vicinity of the take-out port area when the conveyor belt finishes intermittent motion and stops, and returns and is positioned at the take-out port area before the next chip component conveyed by next intermittent motion of the conveyor belt reaches the take-out port area. The vacuum suction nozzle of the electronic component placement machine takes out the chip component at the take-out port area when the conveyor belt is stopped and the stopper is apart from the take-out port area.

6 Claims, 6 Drawing Sheets

CHIP COMPONENT SUPPLY APPARATUS

BACKGROUND OF THE INVENTION

1. Field of the Invention

The present invention relates to a chip component supply apparatus (also referred to herein as a "chip component supply equipment") used in an electronic component placement machine for mounting electronic chip components (hereinafter called chip components) on a circuit board.

2. Description of Related Art

The chip component supply apparatus is used in order that as chip components are supplied in pieces, as shown in FIGS. 6(a) to (d), they may be sent successively into the electronic component placement machine, to be positioned at specified places in specified posture, and as to be taken out by a vacuum suction nozzle. A conventional chip component supply apparatus is shown in FIG. 7.

Figure 7:
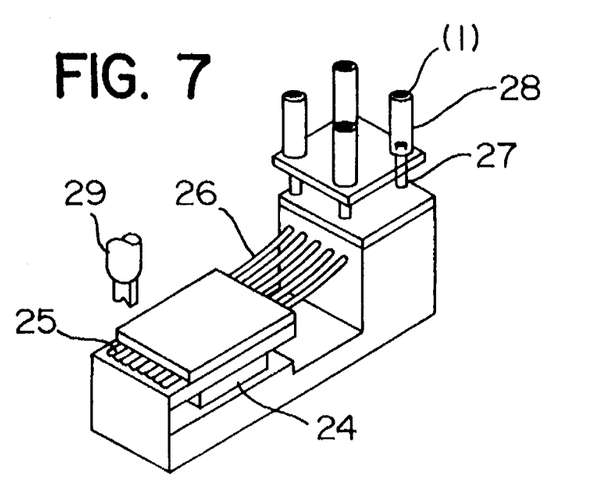
FIG. 7 is a conventional chip component supply equipment.

As shown in FIG. 7, chip components 1 are stored in pieces in a hopper 28, and a fixed pipe 27 is slidably inserted in the bottom of the hopper 28. The hopper 28 is driven vertically by oscillating means, not shown in the drawing, and the chip components 1 drop into the pipe 27. The dropped chip components reach a feeder 24 through a coupled flexible pipe 26, and are driven by the feeder 24 to be carried up to a take-out port 25. The chip components are successively taken out by a vacuum suction nozzle 29 of an electronic component placement machine (not shown) at the take-out port 25, and are mounted on a circuit board. In such conventional chip component supply apparatus, however, chip components may pop out of the apparatus or be positioned irregularly due to vibrations of the equipment. The succeeding chip components driven by the feeder 24 may also push the chip components remaining at the take-out port 25 with a very strong pressure, and the vacuum suction nozzle 29 may fail to take them out occasionally. Additionally, irregular chip components broken by some accident may cause jamming in the take-out port 25, thereby causing the interruption of the operation of the electronic component placement machine.

The invention provides a chip component supply apparatus of a novel construction substantially eliminating the aforementioned problems encountered with previously-known apparatus of this type.

None of the conventional chip component supply equipment provides or suggests a means for preventing pushing of the chip component at the take-out port area by the succeeding chip component and for preventing the vibration of the chip components by the feeder. Accordingly, none of the conventional chip component supply equipment provides a means for facilitating the work of the vacuum suction nozzle to take out the chip components. Furthermore, none of the conventional chip component supply equipment uses a stopper placed apart from the take-out port area, to substantially eliminate the risk of the interference of the vacuum suction nozzle and the chip component with the stopper, and irregular chip components causing jamming in the take-out port area. Thus, such conventional chip component supply equipment fails to provide a means for easing the work of the vacuum suction nozzle to take out the chip components.

SUMMARY OF THE INVENTION

In a first embodiment of the invention, the chip component supply apparatus comprises: a container box for storing chip components in pieces, means for conveying chip components from the container box onto a conveyor belt, the conveyor belt moving intermittently for conveying the transferred chip components toward a take-out port where a vacuum suction nozzle of an electronic component placement machine removes chip components, and a stopper positioned at the take-out port for stopping the chip components conveyed by the conveyor belt at the take-out port, wherein the stopper moves and departs from the take-out port when the conveyor belt finishes intermittent motion, and stops and returns and is positioned at the take-out port before the next chip component conveyed by next intermittent motion of the conveyor belt reaches the take-out port.

The vacuum suction nozzle of the electronic component placement machine takes out the chip components at the take-out port when the conveyor belt is stopped and the stopper is separated from the take-out port.

In a second embodiment of the invention, a chip component supply apparatus comprises:

a container for storing at least one chip component;

a transfer device or a means for transferring the chip component from the container onto an intermittently moving conveyor belt which transfers the chip component to a take-out port area; and a stopper placed in the take-out port area for stopping the chip component at the take-out port area.

In this second embodiment, the transfer device or a means for transferring the chip component comprises a hollow movable pipe having a first end thereof coupled to the bottom of the container and a second end thereof discharging the chip component onto the conveyor belt. This apparatus further comprises a means or a device for removing the chip component from the take-out port area, such as a vacuum suction nozzle, which is a part of an electronic component placement machine. The second embodiment of the invention operates in substantially the same manner as the first embodiment, summarized above.

Yet another embodiment of the invention is directed to a method for transferring at least one chip component from a container to a take-out port area comprising the steps of:

(a) transferring the chip component from the container onto an intermittently moving conveyor belt; and (b) stopping the movement of the component at the take-out port area by a stopper.

In this embodiment, the chip component is transferred from the container onto the conveyor belt by a vertically oscillating hollow movable pipe, coupled to a conveying tube.

Figure 2:
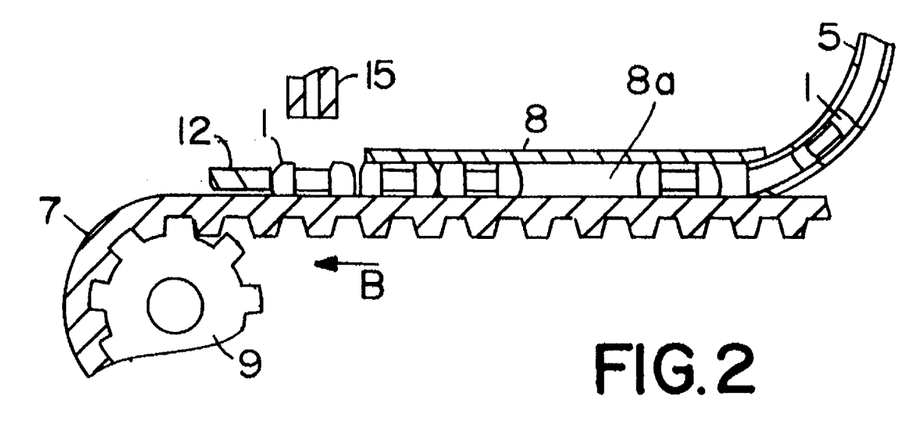
FIG. 2 is a sectional view of a conveyor belt included in the embodiment of the chip component supply equipment of the invention.

The chip component supply apparatus of this invention has a number of advantages. Since the conveyor belt (such as the conveyor belt 7 of FIG. 2) is stopped when the chip component is to be removed, the chip component at the take-out port is not pushed by the succeeding chip component and is not moved by the vibration of the conveyor belt. This facilitates the work of the vacuum suction nozzle to take out or remove the chip component. Furthermore, since the stopper is separated from the take-out port of the apparatus (where the chip component is removed from the apparatus), there is no risk of interference of the vacuum suction nozzle and the chip component, to be taken out, with the stopper, and irregular chip components will not cause jamming in the take-out port. The benefits of the invention also include the ease of work of the vacuum suction nozzle which takes out the chip components.

DETAILED DESCRIPTION OF PREFERRED EMBODIMENTS

The term "chip component," as used herein, designates any type of component commonly used in circuit board assembly, such as transistors, capacitors, resistors, inductors and similar components.

The invention will be described in conjunction with exemplary embodiments thereof illustrated in the figures.

Figure 1:
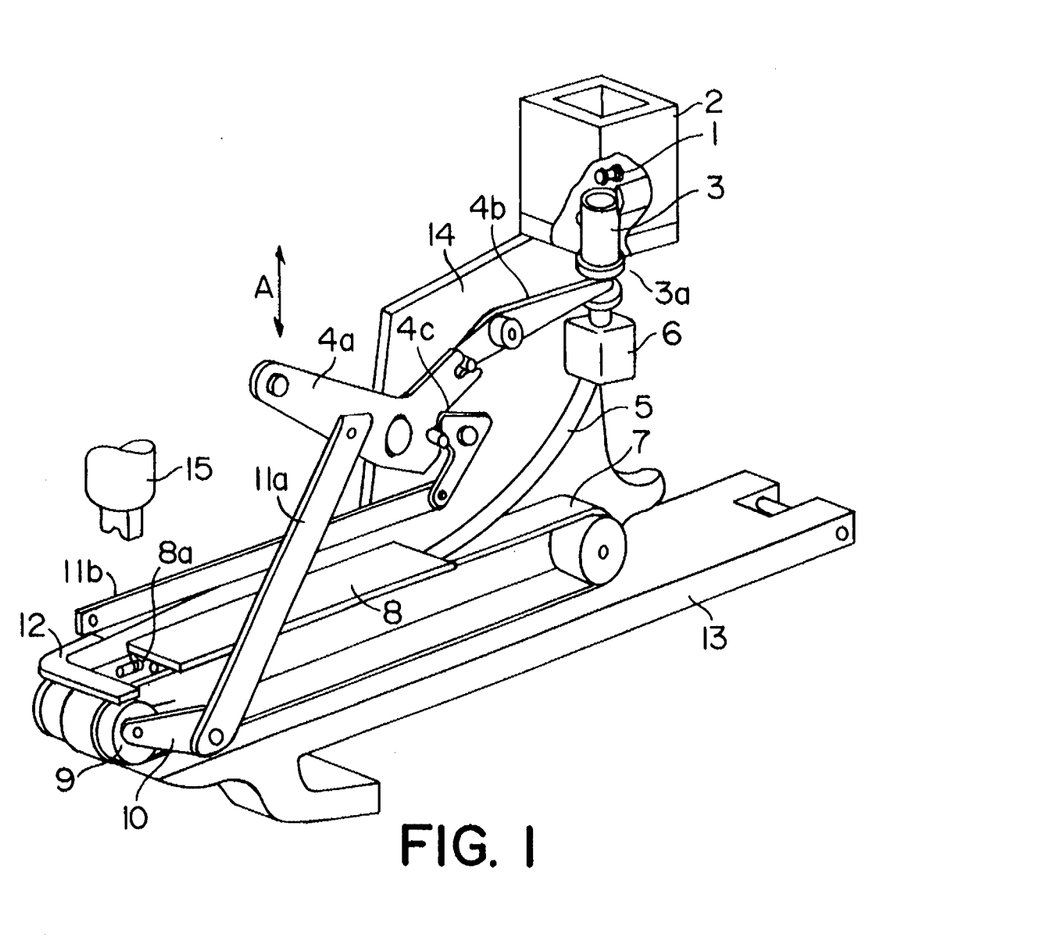
FIG. 1 is a perspective view showing an embodiment of a chip component supply equipment of the invention.

With reference to FIG. 1, a container box 2 stores a multitude of chip components 1 in pieces. A hollow movable pipe 3 is coupled slidably to the bottom of the container box 2. An arrow A indicates the vertical motion of a lever 4a.

An electronic component placement machine (not shown) may comprise a plurality of chip component supply apparatuses of the invention, storing different types of chip components. The lever 4a of the chip component supply apparatus, containing the chip components to be mounted, is vertically driven by an actuator (not shown) of the electronic component placement machine, selectively, and the chip component conveyed to a take-out port area 19 (FIG. 3) is taken out by a vacuum suction nozzle 15, and is mounted on a circuit board (not shown).

Figure 5A:
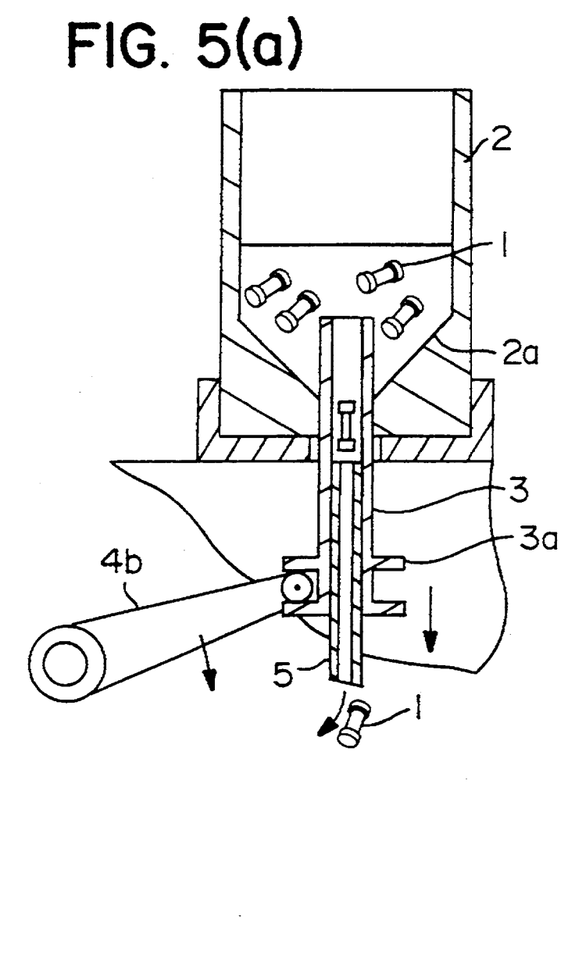
FIGS. 5(a), (b) are sectional views of a container box and a take-out pipe included in the embodiment of the chip component supply equipment of the invention.
Figure 5B:
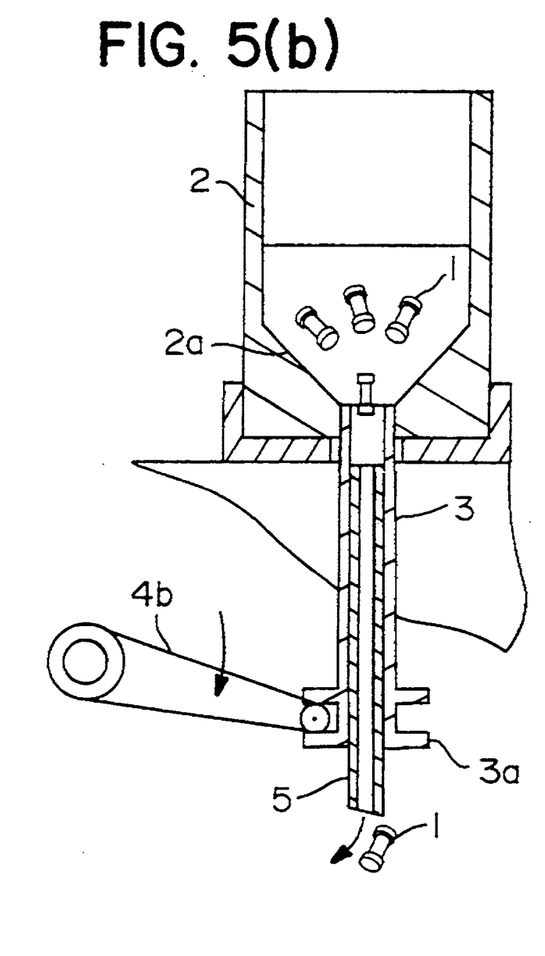
Figure 6A:
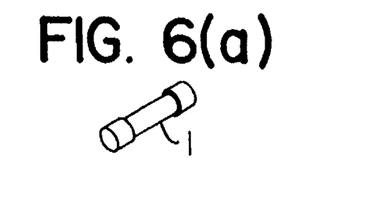
FIG. 6 is a perspective view of several types of chip components.
Figure 6B:
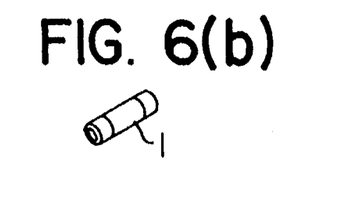
Figure 6C:
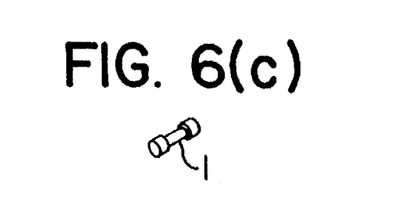
Figure 6D:
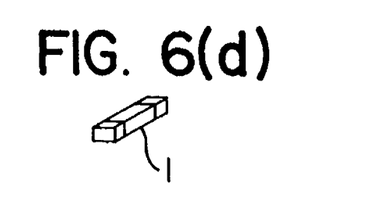

The motion of the lever 4a is transmitted to a neck portion 3a, placed in the lower part of the hollow movable pipe 3 (FIGS. 5(a) and 5(b)), through a lever 4b, which drives the hollow movable pipe 3 vertically inside the container box 2.

Through this motion, the chip components 1 stored in the container box 2 are successively dropped into the movable pipe 3, and the dropped chip components pass through the hollow movable pipe 3 and a conveying tube 5 extended downwardly and coupled to the movable pipe 3, and are discharged to a terminal end of the conveying tube 5. The conveying tube 5 is fixed to a side wall 14 by a holder 6.

The terminal end of the conveying tube 5 is inserted into a guide groove 8a of a guide cover 8 mounted on the conveyor belt 7. The chip components 1 discharged from the terminal end of the conveying tube 5 are aligned in the guide groove 8a, and conveyed toward the take-out port area 19 where a vacuum suction nozzle 15 of the electronic component placement machine takes out the chip components, near the left end of the conveyor belt 7, delivered by the conveyor belt 7 which moves intermittently.

Figure 8:
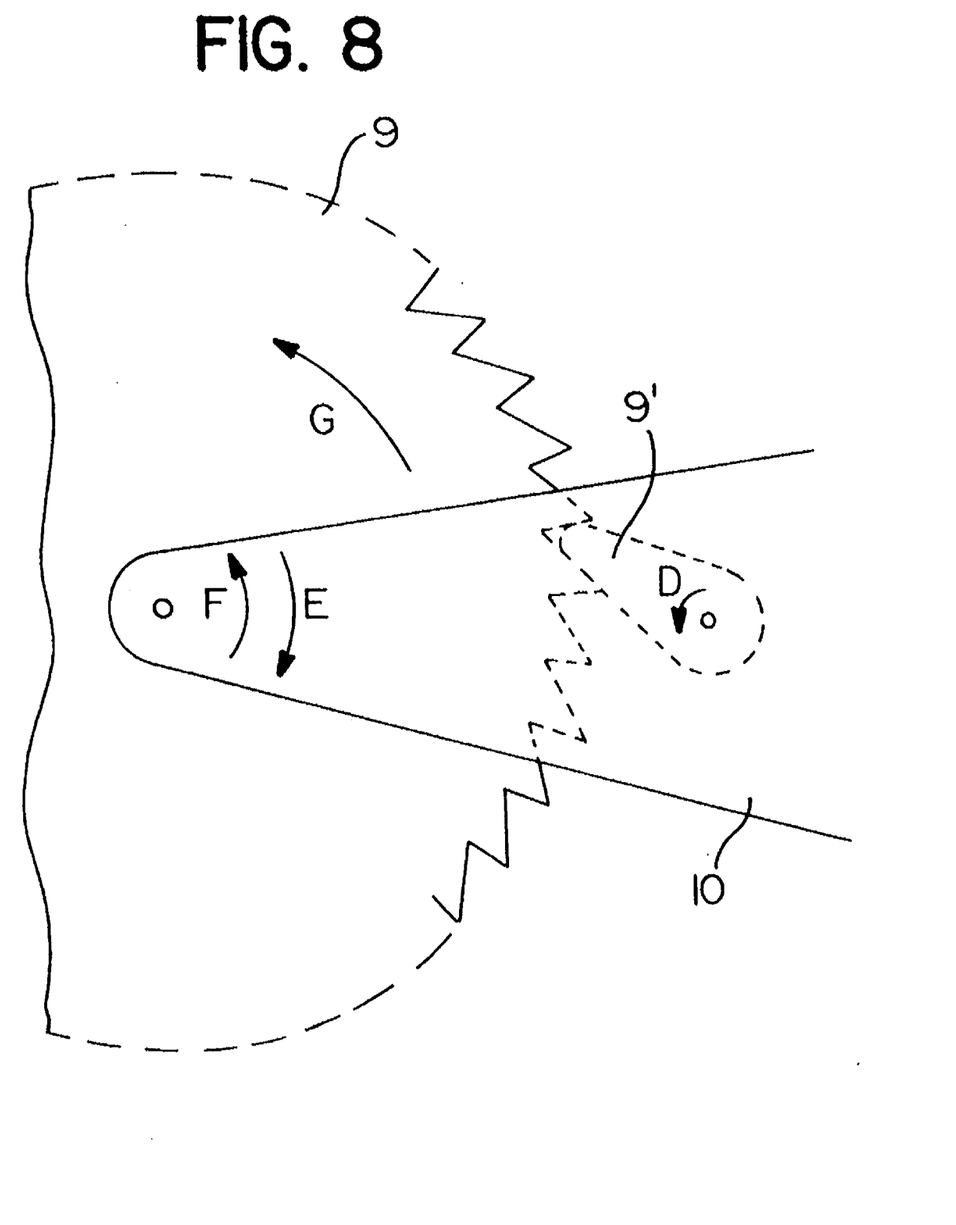
FIG. 8 is an illustration of the ratchet.

As shown in FIG. 8, a ratchet claw 9' is fixed on a ratchet 10 rotationally, and is biased in the direction of arrow D by a spring (not shown) engaging to a ratchet wheel 9.

The motion from the top dead center to the bottom dead center of the lever 4a moves the rachet 10 in the direction of arrow E but does not move the ratchet wheel 9, since the ratchet claw 9' moves around the outer periphery of the ratchet wheel 9 without being caught by the teeth of the ratchet wheel 9.

However, the motion from the bottom dead center to the top dead center of the lever 4a moves the ratchet 10 in the direction of arrow F and rotates the ratchet wheel 9 by a specific angle, since the ratchet claw 9' moves with the ratchet 10 as being caught by the tooth of the ratchet wheel 9 resulting in the rotation of the ratchet wheel 9 by a specific angle in the direction of arrow G. Consequently, the conveyor belt 7 moves intermittently in the direction of arrow B in FIG. 2 with each complete vertical stroke of the lever 4a (i.e., a movement of the lever 4a from the top dead center to the bottom dead center and to the top dead center). The moving distance of one intermittent motion of the conveyor belt 7 is set longer than the length of the chip components 1 to be conveyed.

Figure 4:
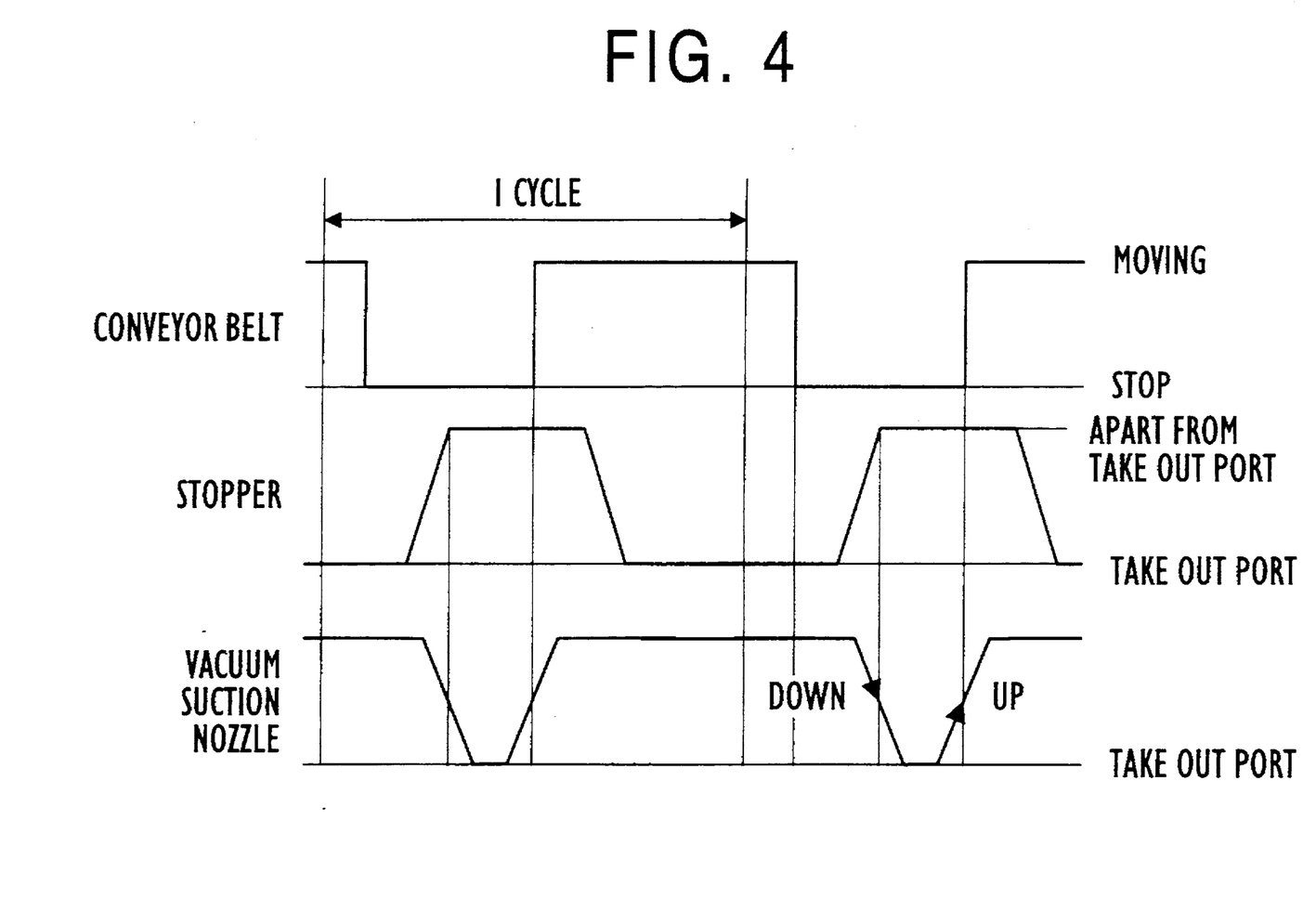
FIG. 4 is a diagram showing the motion of one cycle of the chip component supply equipment of the invention.

One cycle of motion of the conveyor belt 7, a stopper 12, and the vacuum suction nozzle 15 is summarized below and shown schematically in FIG. 4.

(1) The chip components 1 moving together with the intermittently moving conveyor belt 7 are prevented from moving with the conveyor belt 7 beyond the point of location of the stopper 12, located just beyond the take-out port area 19. Slipping occurs between the stopped chip components 1 and the conveyor belt 7 from the end of intermittent motion of the chip components until the conveyor belt 7 is stopped.

Figure 3:
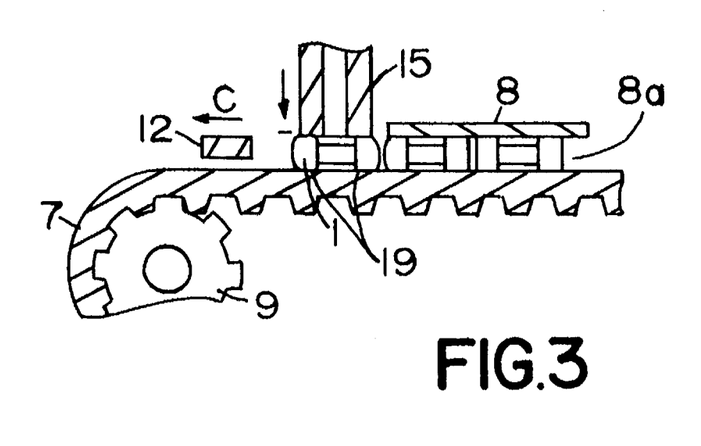
FIG. 3 is a diagram explaining the action of a stopper included in the embodiment of the chip component supply equipment of the invention.

(2) When the conveyor belt 7 stops, as shown in FIG. 3, the stopper 12 moves in the direction of arrow C, and departs from the chip components 1 stopped at the take-out port area 19.

(3) The vacuum suction nozzle 15 descends, and sucks the chip component 1, and then ascends.

(4) The conveyor belt conveys the next chip component toward the take-out port area 19.

(5) The stopper 12 returns toward the take-out port area 19 so as to be located at the take-out port area 19 before the next chip component reaches the take-out port area 19.

These steps take place during the motion of one cycle of the chip component supply apparatus. By repeating the motion of this one cycle, chip components are taken out successively.

In this way, the vacuum suction nozzle of the electronic component placement machine takes out the chip component at the take-out port area 19 while the conveyor belt is stopped and the stopper is separated from the take-out port area 19.

FIG. 5 shows the hollow movable pipe 3 making vertical motions in the container box 2 storing multiple chip components 1 in pieces. The hollow movable pipe 3 is slidably coupled with the container box 2 and the conveying tube 5, and is driven by the lever 4b to make vertical motions, thereby forcing the chip components 1 to drop inside the hollow movable pipe 3. The dropped chip components 1 are then conveyed onto the conveyor belt 7 through the movable pipe 3 and the conveying tube 5.

In one cycle of vertical motion of the hollow movable pipe 3, the hollow movable pipe 3, initially at the upper end of the motion as shown in FIG. 5(a), goes to the lower end as shown in FIG. 5(b), and immediately returns to the upper end. Thus, as compared with its reverse motion, that is, the hollow movable pipe 3 initially at the lower end of the motion going to the upper end and returning to the lower end, the number of chip components 1 falling into the movable pipe 3 is increased, so that the chip components 1 may be supplied more securely.

A slope 2a inside the container box 2 makes it easier to concentrate the chip components in one position.

In the embodiments described above, the vertical motion of the hollow movable pipe 3 in the container box 2, the intermittent motion of the conveyor belt 7, and the motion of the stopper 12 are all created by the power of the actuator of the electronic component placement machine (not shown) which moves the lever 4a vertically. The invention is, however, not limited only to this embodiment. For example, the movable pipe 3, the conveyor belt 7, and the stopper 12 may comprise known driving sources, such as a motor or a solenoid, and such driving sources may cooperate to produce the same motions as in the foregoing embodiments, thereby realizing the invention.

The invention is also not limited to the use of the illustrated vacuum suction nozzle 15 for removing the chip components from the take-out port area 19. Any other suitable means may be used for that purpose, such as mechanical grippers or tongs.

Similarly, the invention is not limited to the use of the stopper having the construction described above and illustrated in the Figures. Any other stopper means performing substantially the same function can be utilized, such as a triangular, circular or semicircular stopper.

The embodiments described above provide a number of significant advantages. Since the conveyor belt 7 is stopped while the chip component is removed by the vacuum suction nozzle 15, the chip component at the take-out port area 19 will not be pushed by the succeeding chip component, and will not be moved by the vibration of the conveyor belt 7. This facilitates the work of the vacuum suction nozzle 15 to take out the chip component. Moreover, since the stopper is separated from the take-out portion area 19, there is no risk of interference of the vacuum suction nozzle and the chip component to be taken out with the stopper, and irregular chip components will not cause jamming in the take-out port area 19. All these benefits make it easier for the vacuum suction nozzle 15 to remove the chip components.

Of course, it should be understood that a wide range of changes and modifications can be made to the preferred embodiments described above. It is therefore intended that the foregoing detailed description be regarded as illustrative rather than limiting, and that it be understood that it is the following claims, including all equivalents, which are intended to define the scope of this invention.

What is claimed is:

1. A chip component supply apparatus comprising:

a container box for storing chip components in pieces, a conveyor belt, a means for transferring chip components from the container box onto the conveyor belt, a guide groove having an inlet and an outlet for aligning the chip components on the conveyor belt, the conveyor belt moving intermittently for conveying the transferred chip components toward a take-out port area located close to the outlet of the guide groove where a vacuum suction nozzle of an electronic component placement machine picks up the chip components from the conveyor belt, and a stopper positioned at the take-out port area for stopping the chip components conveyed by the conveyor belt at the take-out port area, wherein the stopper moves and departs from the take-out port area when the conveyor belt finishes intermittent motion, and stops and returns and is positioned at the take-out port area before the next chip component conveyed by the next intermittent motion of the conveyor belt reaches the take-out port area.

2. A chip component supply apparatus according to claim 1, wherein the means for transferring chip components from the container box onto the conveyor belt comprises:

a hollow movable pipe slidably coupled to the bottom of the container box at one end, being driven so that the one end may be moved up and down intermittently in the container box, and a conveying tube coupled to the hollow movable pipe and extended downward, and further wherein the hollow movable pipe intermittently repeats motions of one cycle moving vertically, and the motion of one cycle comprises:

(1) the movable pipe initially at the upper end of motion, and (2) the movable pipe going to the lower end of motion, then returning to the upper end immediately.

3. A chip component supply apparatus according to claim 1, wherein the moving distance of one intermittent motion of the conveyor belt is longer than the length of the chip components to be conveyed.

4. A chip component supply apparatus comprising:

a container for storing chip components;

an intermittently moving conveyor belt;

a transfer device for transferring the chip components from the container onto said intermittently moving conveyor belt, said conveyor belt transferring the chip components to a take-out port area located close to an outlet of a guide groove, the guide groove having an inlet and the outlet for aligning the chip components on the conveyor belt; and a stopper for stopping the chip components at the take-out port area.

5. A chip component supply apparatus of claim 4, which further comprises a device for picking up the chip components from the conveyor belt.

6. A chip component supply apparatus of claim 5, wherein the device for picking up the chip components comprises a vacuum suction device.

\* \* \* \* \*

UNITED STATES PATENT AND TRADEMARK OFFICE
CERTIFICATE OF CORRECTION

PATENT NO. : 5,525,023
DATED : June 11, 1996
INVENTOR(S) : Tomitatu Soga et al.

It is certified that error appears in the above-identified patent and that said Letters Patent is hereby corrected as shown below:

Column 6, line 56, Change "device" to --nozzle--.

Signed and Sealed this

Fourth Day of February, 1997

Attest:

BRUCE LEHMAN

*Attesting Officer*   *Commissioner of Patents and Trademarks*